(12) United States Patent
Jeddeloh

(10) Patent No.: US 6,199,138 B1
(45) Date of Patent: Mar. 6, 2001

(54) CONTROLLING A PAGING POLICY BASED ON A REQUESTOR CHARACTERISTIC

(75) Inventor: Joseph M. Jeddeloh, Minneapolis, MN (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/200,622

(22) Filed: Nov. 30, 1998

(51) Int. Cl.[7] .............................. G06F 13/00; G11C 7/00
(52) U.S. Cl. ...................... 711/105; 711/154; 365/193; 365/238.5
(58) Field of Search ................................. 711/105, 154; 365/193, 238.5

(56) References Cited

U.S. PATENT DOCUMENTS

| | | | |
|---|---|---|---|
| 5,664,153 | * 9/1997 | Farrell | 711/154 |
| 5,848,025 | * 12/1998 | Marietta et al. | 365/238.5 |
| 5,983,325 | * 11/1999 | Lewchuk | 711/137 |
| 6,052,134 | * 4/2000 | Foster | 345/521 |
| 6,052,756 | * 4/2000 | Barnaby et al. | 711/105 |

OTHER PUBLICATIONS

U.S. Patent Application Serial No. 09/201,456, entitled "Requestor Based Memory Access Control," Nov. 30, 1998.

* cited by examiner

Primary Examiner—David L. Robertson
(74) Attorney, Agent, or Firm—Trop, Pruner & Hu, P.C.

(57) ABSTRACT

A memory access control technique includes receiving a memory access request indication, performing a memory access operation in accordance with the memory access request (the memory access operation directed to a page of memory), determining a characteristic of a memory access requester based on the memory access request indication, and executing a paging policy based on the determined characteristic. Requestor characteristics may include the requester specifying a paging policy, identification of the particular requester, and identification of the type of requester. The paging policy may be to maintain the accessed page of memory in an open state, or to close the accessed page following completion of the memory access operation.

20 Claims, 3 Drawing Sheets

CONTROLLING A PAGING POLICY BASED ON A REQUESTOR CHARACTERISTIC

This application is related to U.S. patent application Ser. No. 09/201,456, filed on Nov. 30, 1998.

BACKGROUND

The invention relates to computer system memory architectures and, more particularly, to the control of memory access operations based on a characteristic of the entity requesting the memory access.

Many current computer system memory architectures use synchronous random access memories (synchronous RAM) such as synchronous dynamic random access memory (SDRAM), SyncLink dynamic random access memory (SLDRAM), and Rambus dynamic random access memory (RDRAM) memory. The SyncLink standard has been assigned the tentative designation of IEEE-1596.7 by the Microprocessor & Microcomputer Standards Committee (MMSC) of the Institute of Electrical and Electronics Engineers (IEEE). The Rambus® standard is published by Rambus, Incorporated of Mountain View, Calif.

In addition to providing inherently faster operation than previous types memories, synchronous RAM may generally be organized into banks. Banks represent a physical compartmentalization of memory space, where each bank may correspond to a unit or array of physical memory. A bank may be further divided into pages, where a page is typically defined in terms of a row address. That is, all those memory locations in a bank having a common row address are said to be on the same page of memory.

One feature of banked memory systems is that consecutive memory access operations to a common page may be performed faster than consecutive memory access operations directed to different pages within the same bank. As shown in FIG. 1, the time to perform first access 100 (directed to a first page in a first bank) includes the time needed to select the target page 102 and the time to select the uniquely targeted memory location 104. If second access 106 is directed to a memory location in the same page, the only time required to complete the memory transfer is that needed to select the target location 108; no time is required for page selection. If a subsequent, third access 110 is directed to a different page in the same bank however, the previously selected (open) page must be closed (an operation referred to as precharging 112) before access 110 may proceed. Following precharge operation 112, access 110 continues through page selection 114 and data selection 116 phases. Because precharge operations require some time to complete, they generally limit the speed with which a sequence of memory access operations may be performed. (Use of multiple banks may allow the time for some memory precharge operations to be hidden. For example, if a first memory access is to a first bank, and a second memory access is to a second bank, the precharge operation for the first bank may occur while initiating memory access to the second bank.)

Some attempts have been made, based on the ability to keep one or more pages open simultaneously (generally limited to one page per bank), to minimize data transfer interruptions caused by precharge time intervals. As indicated is above, by leaving a page open after completing a memory access operation the precharge time penalty is avoided when a subsequent bank access is directed to that same page (a page hit). Conversely, when a subsequent bank access is to a different page (a page miss), the open page must be closed and the precharge operation performed before the memory access operation may proceed. Therefore, while there exists benefits to leaving a page open in the event there are frequent page hits, there also exists significant time penalties associated with a large number of page misses when pages are kept/left open.

Thus, there is a need for a technique that maintains a recently accessed memory page in the open state if subsequent access operations are likely to generate page hits, and closes the page if subsequent access operations are likely to generate page misses.

SUMMARY

In one embodiment the invention provides a method to access computer system memory. The method includes receiving a memory access request indication, performing a memory access operation in accordance with the memory access request (the memory access operation directed to a page of memory), determining a characteristic of a memory access requester based on the memory access request indication, and executing a paging policy based on the determined characteristic. Requestor characteristics include, but are not limited to, the requester specifying a paging policy, identification of the particular requester (e.g., a graphics device or a computer processor), and identification of the type of requester (e.g., a device exhibiting memory access locality or a device lacking memory access locality). The paging policy may be to maintain the accessed page of memory in an open state, or to close the accessed page following completion of the memory access operation.

DETAILED DESCRIPTION

Techniques (including methods and devices) to control computer system memory access operations based on a characteristic of the requesting entity are described. The following embodiments of this inventive concept are illustrative only and are not to be considered limiting in any way.

Figure 2:
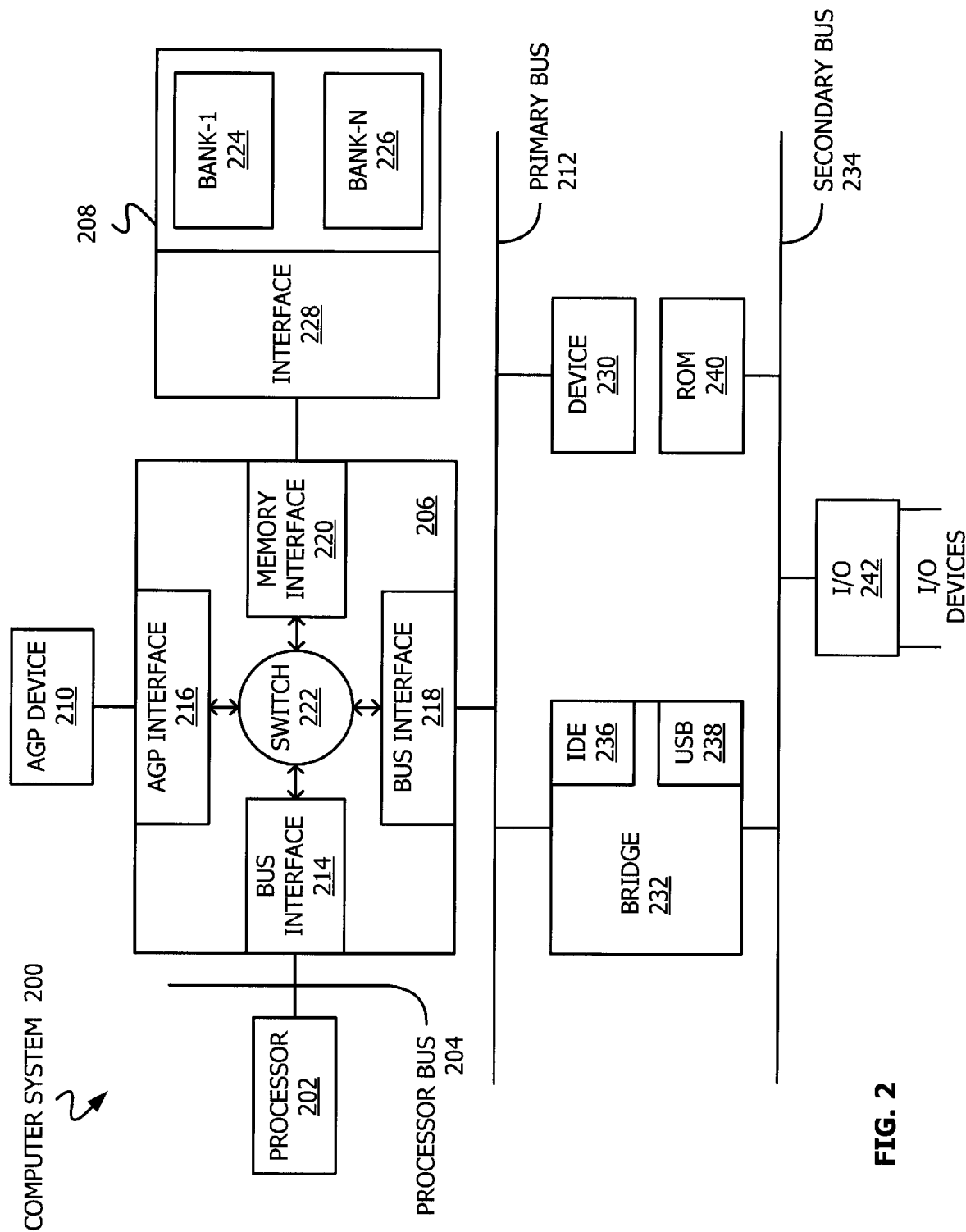
FIG. 2 shows a computer system having a banked memory architecture in accordance with one embodiment of the invention.

FIG. 2 shows computer system 200 having a banked memory architecture in accordance with one embodiment of the invention. As shown, computer system 200 includes host processor 202 coupled to processor bus 204. Host processor may be any type of general or special purpose processor. For example, host processor 202 may be a general purpose microprocessor or a special purpose digital signal processor, graphics processor, or device controller. Processor bus 204 may be any type of communication channel suitable for coupling host processor 202 to other computer system devices.

Bridge circuit 206 couples processor bus 204 to system memory 208, accelerated graphics port (AGP) device 210, and primary bus 212. As shown, bridge circuit 206 also includes processor bus interface 214 for communicating with processor bus 204, AGP interface 216 for communicating with AGP unit 210, bus interface 218 for communicating with primary bus 212, memory interface 220 for communicating with system memory 208, and switch 222. Switch 222 may be any type of switching mechanism that is able to selectively couple each of the interfaces 214, 216, 218, and 220.

System memory 200 may be any type of synchronous RAM that is organized into one or more banks. For example, bank-1 224 through bank-N 226. In some embodiments, each bank (e.g., bank-1 224) may be comprised of a plurality of memory devices or chips. System memory 208 also includes interface 228 for communicating with memory interface 220 of bridge circuit 206.

Primary bus 212 provides a mechanism to couple bus device 230 to computer system 200. An illustrative primary bus is the Peripheral Component Interface (PCI) bus. Illustrative bus devices (e.g., device 230) include network interface cards (NIC) and Small Computer System Interface (SCSI) devices such as magnetic hard disks.

Bridge circuit 232 couples primary bus 212 to secondary bus 234. In some embodiments, bridge circuit 232 also provides Intelligent Drive Electronics (IDE) interface 236 for communicating with IDE devices (not shown) and Universal Serial Bus (USB) interface 238 for communicating with USB devices (not shown). Typically, secondary bus 234 also provides a mechanism to couple system read only memory (ROM) 240 and a variety of input-output (I/O) devices such as floppy disks (through I/O circuit 242) to computer system 200. Illustrative secondary buses include the Industry Standard Architecture (ISA) and Extended Industry Standard Architecture (EISA) buses.

As the number and operating speed of different entities (e.g., processor 202, AGP unit 210, and bus device 230) that access system memory 208 increase, memory systems are under increasing pressure to provide access at faster rates to keep pace.

Figure 3:
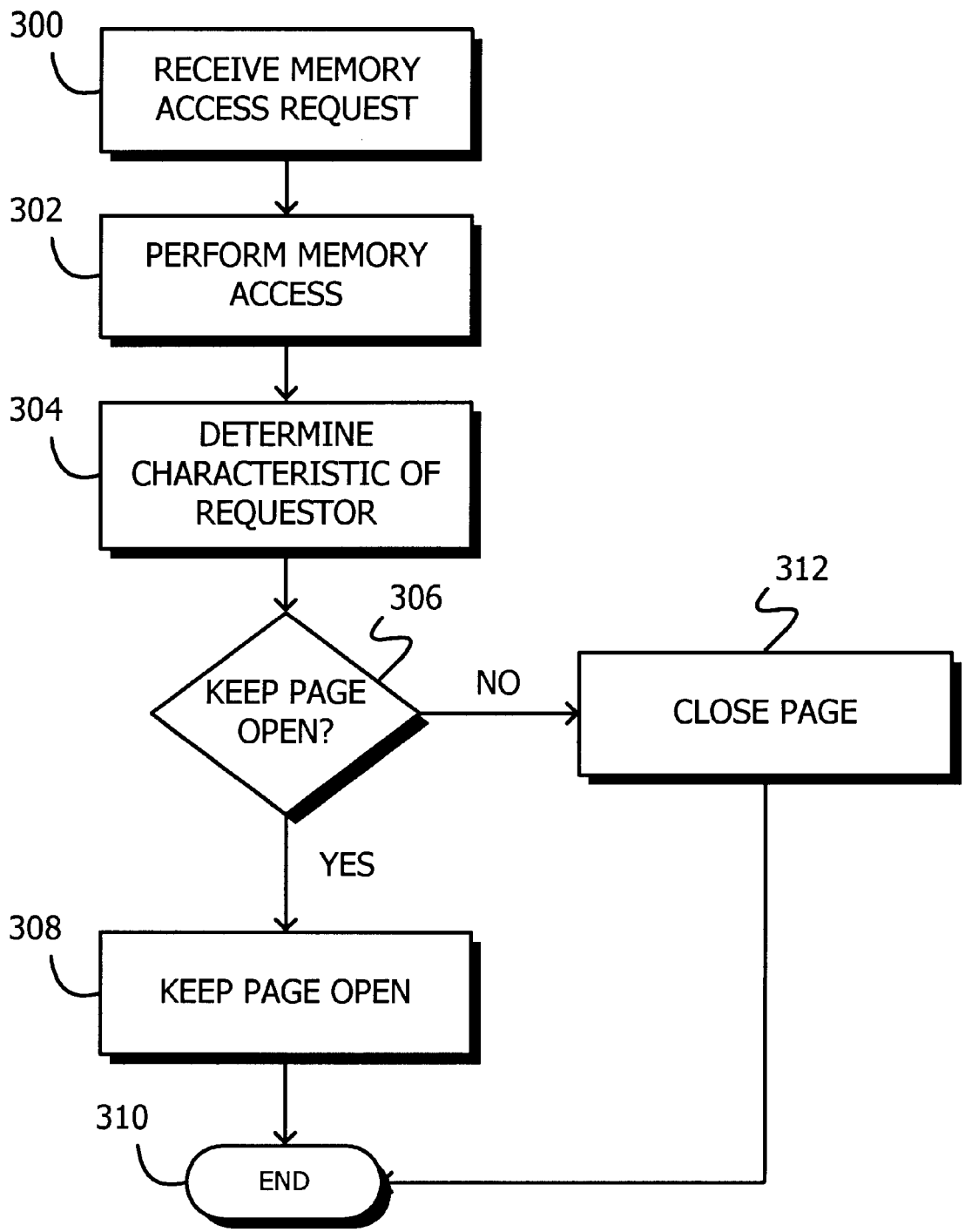
FIG. 3 shows a flowchart for a memory access technique in accordance with one embodiment of the invention.

One method that may increase the overall memory access rate in computer system 200 in accordance with the invention is shown in FIG. 3. Initially memory interface 220 receives an access request indication that may originate from any device coupled to computer system 200 (block 300). An access request indication may, for example, comprise a plurality of digital signals which together indicate a memory access request. In general, the access request indication may be generated by the requesting device or entity (hereinafter a requester), and transmitted to bridge circuit 206 by the appropriate communication channel (e.g., processor bus 204 and primary bus 212). The receiving interface circuit (e.g., interface 214, 216, and 218) routes the indication to memory interface 220 via switch 222. Memory interface 220 may then generate the necessary signals to effect the requested memory access (block 302). Memory interface 220 may also determine a characteristic of the requester such as whether the requester is more or less likely to generate a page hit in its next access (block 304). If memory interface 220 determines that the requester is likely to generate a page hit in a subsequent access request (the 'yes' prong of diamond 306), the just accessed page is kept open (block 308) and processing of the current memory access operation terminates (block 310). If, on the other hand, interface 220 determines that the requestor is likely to generate a page miss in a subsequent access (the 'no' prong of diamond 306), the just accessed page is closed (block 312) and processing terminates (310).

Some devices, such as processors (e.g., host processor 202), typically exhibit memory access patterns that are not grouped within a common page of system memory 208. Other devices, for example block oriented transfer devices (e.g., direct memory access (DMA) devices such as graphics unit 210 and, possibly, bus device 230), typically issue memory access requests that are highly localized. That is, they tend to generate sequences of memory access requests that are directed to a single page.

Thus, in one embodiment of the invention, memory interface 220 may use information identifying the type of requester to keep a page open. For example, if the memory access request is from a processor, the page may be closed and if the request is from a DMA oriented device, the page may be kept open. In another embodiment of the invention, a requester may identify itself in its memory access request. In yet another embodiment of the invention, a requester may specify whether the addressed page should be kept open or, alternatively, whether it should be closed. In still another embodiment of the invention, a bus arbiter (not shown in FIG. 2) may modify the requestor's memory request indication to identify the requester. And in still another embodiment of the invention, switch 222 or bridge circuit interfaces (i.e., 214, 216, and 218) may modify memory access request indications destined for memory interface 220 to identify the interface (indicating the type of requester) from which the access request indication was received.

Figure 1:
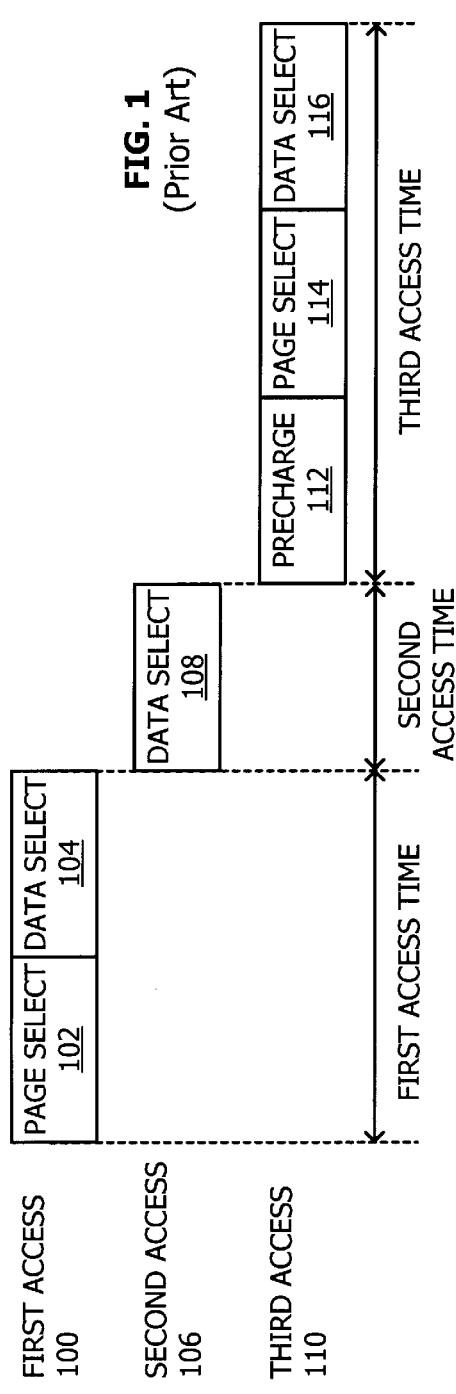
FIG. 1 shows an illustrative series of memory access operations to a common bank of memory.
Figure 4:
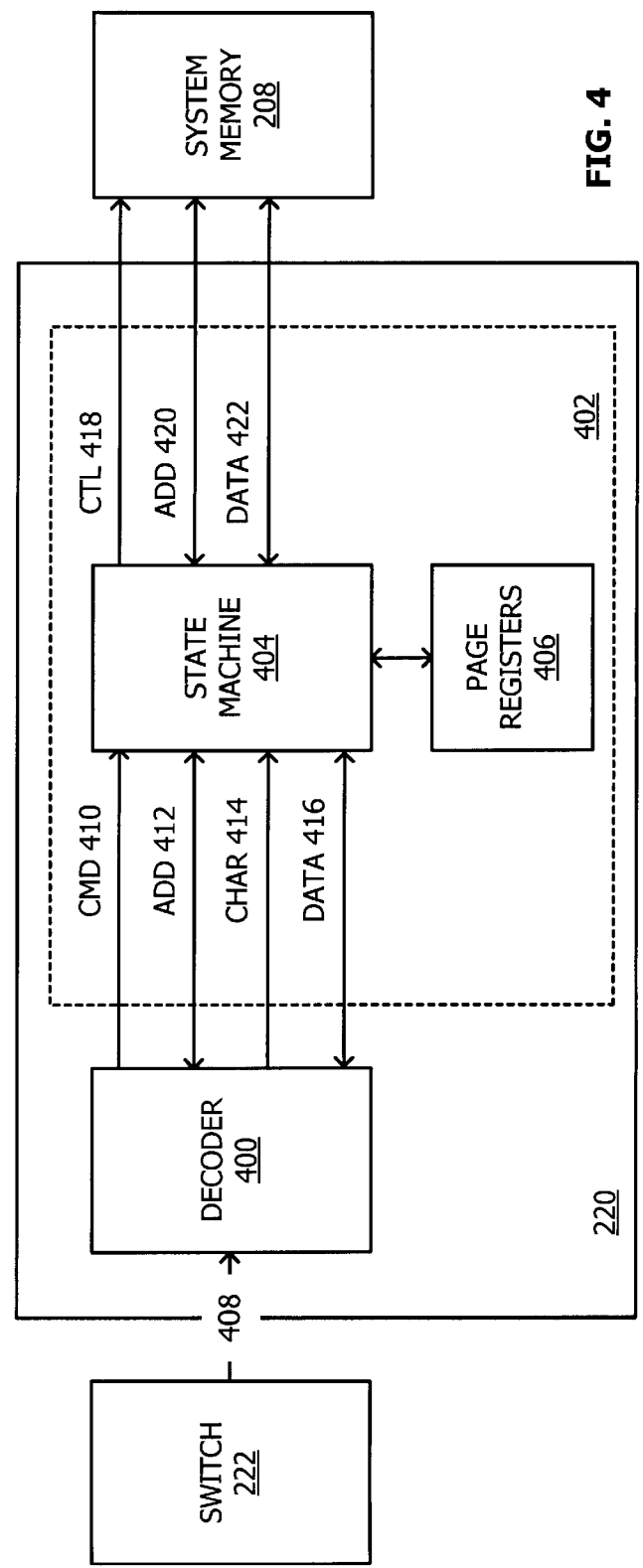
FIG. 4 shows a block diagram for a memory interface in accordance with one embodiment of the invention.

Referring to FIG. 4, memory interface 220 in accordance with one embodiment of the invention includes decoder 400 and memory controller 402. Memory controller 402 comprises state machine 404 and page registers 406. Decoder 400 receives access request indication 408 from switch 222 and decodes it into memory access command (CMD) 410 (identifying access request 408 as a read command or a write command), address (ADD) 412 (identifying a unique location in memory 208), characteristic (CHAR) 414 and, if command 410 indicates a write command, data 416. As discussed above, illustrative characteristics 414 include identification of the requester, identification of the type of requester making the access request, and whether the requester itself indicates whether the currently addressed page should remain open.

State machine 404 generates control (CTL) 418, address (ADD) 420 and data 422 signals appropriate to the particular memory devices comprising system memory 208. Illustrative control signals 418 include the row address strobe (RAS; designating a page within memory 208), column address strobe (CAS; designating a unique location within the page identified by RAS), bank select, and write enable (WE) signals. Page registers 406 may be used to indicate which page or pages are currently open in memory 208. Memory controller 402 may keep the page indicated by address 412 in the open state or it may close the page following completion of the access operation based on characteristic 414.

In determining whether to maintain a recently accessed memory page in the open state, memory controller 402 may make a distinction between a requestor's read and write access requests. For example, a requester may exhibit access locality during read operations but not write operations. In these situations, memory controller 402 may keep such a requestor's last read accessed page open, while closing pages following write operations by the requester. It is recognized that this approach may require memory controller 402 to track and distinguish between read and write operations for one or more entities. Such information may be acquired through a combination of information provided by CMD 410 and CHAR 414 indications and may be stored within memory controller 402 itself or in system memory 208.

Techniques (methods and apparatus) in accordance with the invention may effectively increase memory throughput by reducing memory interface stalls caused by precharge operations by selectively maintaining pages in an open state. Pages may be selectively maintained in the open state based on one or more characteristics of the requestor. Typically, the characteristic relates to a requestor's tendency to access consecutive locations within a single page of memory and may be supplied by the requester itself, or determined by a memory control device having access to requester identification information.

Various changes in the materials, components, circuit elements, as well as in the details of the illustrated operational method are possible without departing from the scope of the claims. For instance, computer system 200 may include more devices (e.g., processors, bus devices 230, and I/O devices) or fewer devices than shown in FIG. 2. Further, not all devices that access system memory 208 need be characterized in a manner in conformance with the above description. For instance, memory controller 402 may selectively maintain pages in an open state for host processor 202, AGP unit 210, and bus device 230 while applying a default paging policy for other devices such as I/O devices. In one embodiment, the default paging policy may be to immediately close accessed memory pages. In another embodiment, the default paging policy may be to maintain accessed pages in the open state.

Additionally, methods in accordance with FIG. 3 may perform steps 302 and 304 in reverse order. That is, memory controller 402 may first determine a characteristic of the requester and then perform the requested memory operation. Further, acts in accordance with FIG. 3 may be performed by a custom designed state machine (embodied in an application specific integrated circuit or ASIC, for example) or a programmable control device executing instructions organized into a program module. A programmable control device may be a computer processor, and storage devices suitable for tangibly embodying program instructions include all forms of non-volatile memory including, but not limited to: semiconductor memory devices such as EPROM, EEPROM, and flash devices; magnetic disks (fixed, floppy, and removable); other magnetic media such as tape; and optical media such as CD-ROM disks.

While the invention has been disclosed with respect to a limited number of embodiments, numerous modifications and variations will be appreciated by those skilled in the art. It is intended, therefore, that the following claims cover all such modifications and variations that may fall within the true sprit and scope of the invention.

What is claimed is:

1. A method to access computer memory, comprising:
   receiving a memory access request indication from a memory access requestor;
   performing a memory access operation in accordance with the memory access request indication, the memory access operation directed to a page of memory;
   determining whether the memory access requestor is a blodk-transfer oriented device; and
   executing a paging policy based on the determination.

2. The method of claim 1, wherein the act of executing a paging policy comprises keeping the memory page open if the memory access requestor so indicates.

3. The method of claim 1, wherein the act of executing a paging policy comprises keeping the memory page open if the memory access requestor is a graphics device.

4. The method of claim 1, wherein the act of executing a paging policy comprises keeping the memory page open if the memory access requestor is a direct memory access device.

5. The method of claim 1, wherein the act of executing a paging policy comprises keeping the memory page open if the memory access requestor is a magnetic hard disk device.

6. The method of claim 1, wherein the act of executing a paging policy comprises closing the memory page open if the memory access requestor does not indicate the page should be kept open.

7. The method of claim 1, wherein the act of executing a paging policy comprises closing the memory page open if the memory access requestor is a computer processor.

8. The method of claim 1, wherein the act of performing a memory access operation comprises reading from a specified location in the memory page.

9. The method of claim 1, wherein the act of performing a memory access operation comprises writing to a specified location in the memory page.

10. The method of claim 1, wherein the act of determining comprises decoding the memory access request indication.

11. A method to access computer memory, comprising:
    receiving a memory access request indication;
    performing a memory access operation in accordance with the memory access request indication, the memory access operation directed to a page of memory;
    determining a characteristic of a memory access requestor based on the memory access request indication; and
    executing a paging policy based on the determined characteristic, including keeping the memory page open if the determined characteristic indicates the memory access requestor is a block-transfer oriented device.

12. The method of claim 11, wherein the act of executing a paging policy comprises keeping the memory page open if the determined characteristic indicates the memory access requestor comprises a graphics device.

13. The method of claim 11, wherein the act of executing a paging policy comprises keeping the memory page open if the determined characteristic indicates the memory access requestor comprises a direct memory access device.

14. The method of claim 1, wherein the act of executing a paging policy comprises keeping the memory page open if the determined characteristic indicates the memory access requestor comprises a magnetic hard disk device.

15. The method of claim 1, wherein the act of executing a paging policy comprises closing the memory page open if the memory access requester indicates the page should be kept open.

16. A method to access computer memory, comprising:
    receiving a memory access request indication;
    performing a memory access operation in accordance with the memory access request indication, the memory access operation directed to a page of memory;
    determining a characteristic of a memory access requestor based on the memory access request indication; and
    executing a paging policy based on the determined characteristic, including closing the memory page if the determined characteristic indicates the memory access requestor is not a block-transfer oriented device.

17. The method of claim 16, wherein the act of executing a paging policy comprises closing the memory page if the determined characteristic indicates the memory access requestor is not a graphics device.

18. The method of claim 16, wherein the act of executing a paging policy comprises closing the memory page if the determined characteristic indicates the memory access requestor is not a direct memory access device.

19. The method of claim 16, wherein the act of executing a paging policy comprises closing the memory page if the determined characteristic indicates the memory access requestor is not a magnetic hard disk device.

20. The method of claim 16, wherein the act of executing a paging policy comprises closing the memory page if the memory access requestor does not indicate the page should be kept open.

* * * * *

UNITED STATES PATENT AND TRADEMARK OFFICE
CERTIFICATE OF CORRECTION

PATENT NO. : 6,199,138  
DATED : March 6, 2001  
INVENTOR(S) : Joseph Jeddeloh

Page 1 of 1

It is certified that error appears in the above-identified patent and that said Letters Patent is hereby corrected as shown below:

Column 5, line 50, "blodk" should be --block--.

Signed and Sealed this

Fifth Day of June, 2001

*Attest:*

NICHOLAS P. GODICI

*Attesting Officer*

*Acting Director of the United States Patent and Trademark Office*